United States Patent [19]

Searson et al.

[11] Patent Number: 5,139,624
[45] Date of Patent: Aug. 18, 1992

[54] METHOD FOR MAKING POROUS SEMICONDUCTOR MEMBRANES

[75] Inventors: Peter C. Searson, Baltimore, Md.; John M. Macaulay, Summit, N.J.

[73] Assignee: SRI International, Menlo Park, Calif.

[21] Appl. No.: 624,422

[22] Filed: Dec. 6, 1990

[51] Int. Cl.[5] .............................. C25F 3/12; C25F 3/30
[52] U.S. Cl. .............................. 204/129.3; 204/129.55; 204/129.75; 204/129.95
[58] Field of Search ........... 204/129.3, 129.55, 129.75, 204/129.95

[56] References Cited

U.S. PATENT DOCUMENTS 4,069,121  1/1978  Baud et al. .................... 204/129.3

Primary Examiner—Donald R. Valentine
Attorney, Agent, or Firm—Paul Hickman

[57] ABSTRACT

A method for making a self-supporting porous semiconductor membrane characterized by the electrolytic etching of a surface of a semiconductor wafer until at least one pore propagates fully through the wafer. The wafer forms the anode of the cell and a relatively inert material, such as platinum, forms the cathode of the cell. The electrolyte is a mixture of HF, $H_2O$ and possibly a wetting agent. One side of the semiconductor wafer is shielded from the electrolyte and pores are allowed to propagate through the body of the wafer towards the shielded side. In one embodiment of the invention the pores are allowed to propagate fully through the body of the wafer and in another embodiment the pores are partially propagated through the wafer and then material is removed from the shielded side of the wafer to expose the pores. Also disclosed are asymmetrical filters and molecular sieves, an electronic component utilizing a porous semiconductor membrane and a micromechanical device using a porous semiconductor membrane.

24 Claims, 5 Drawing Sheets

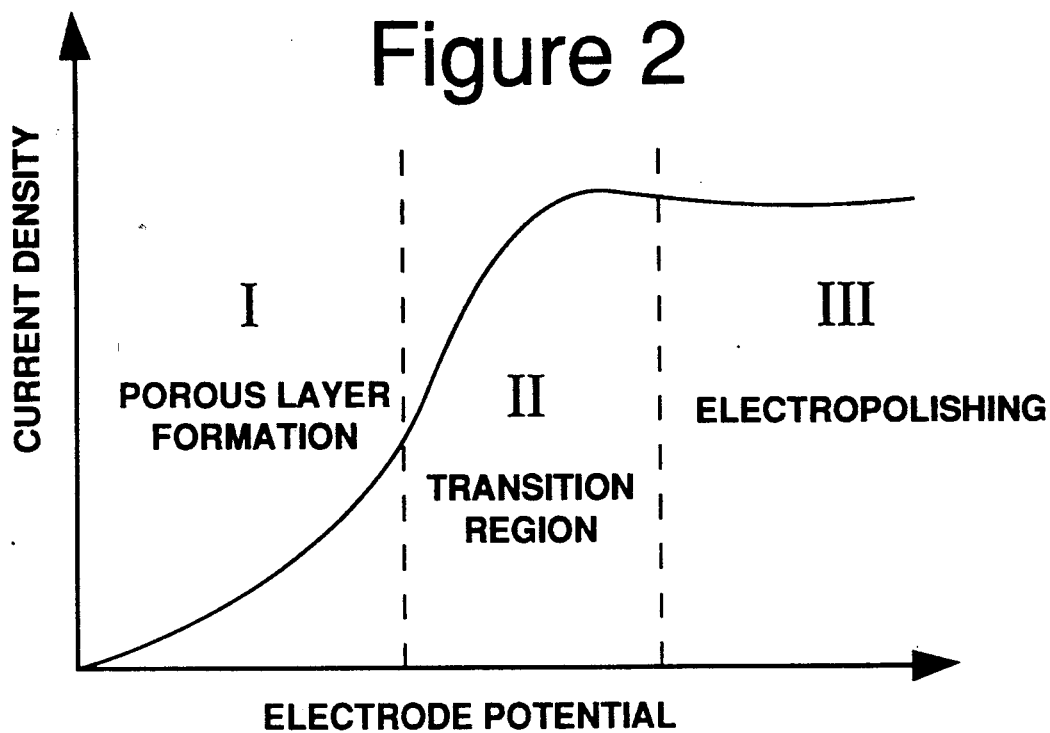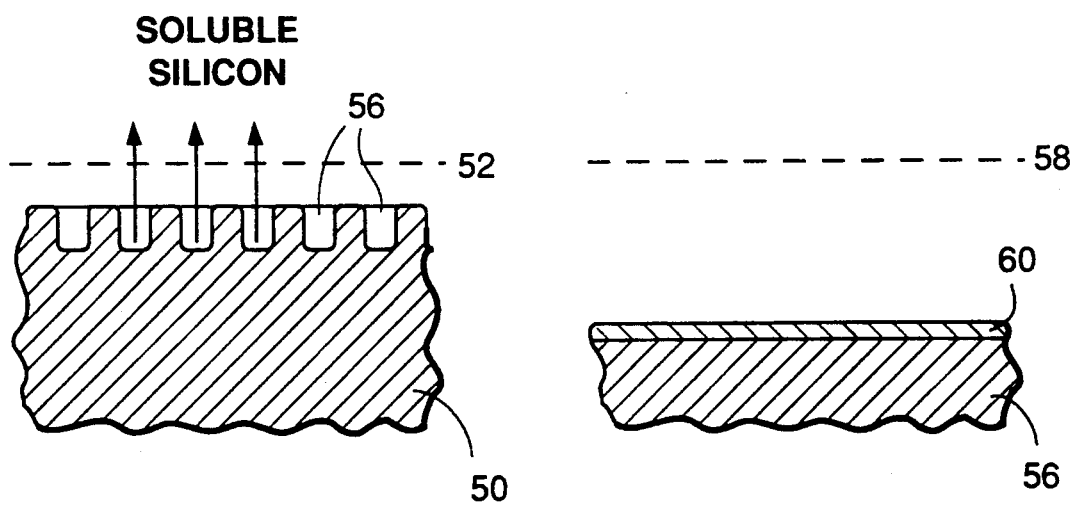

Figure 4a
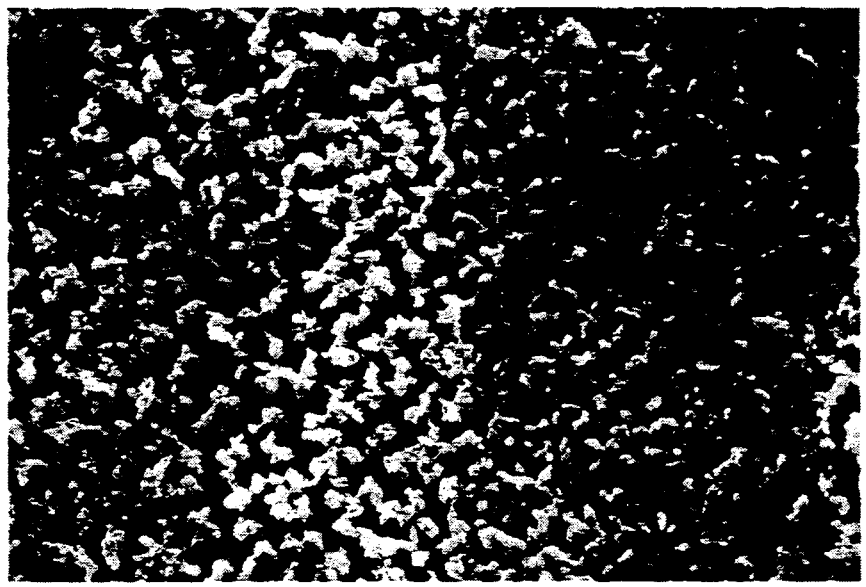
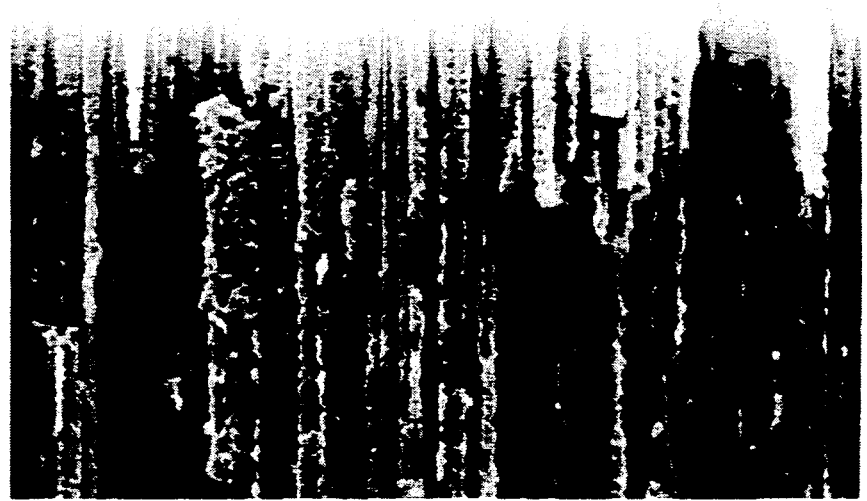
Figure 4b

Figure 5a
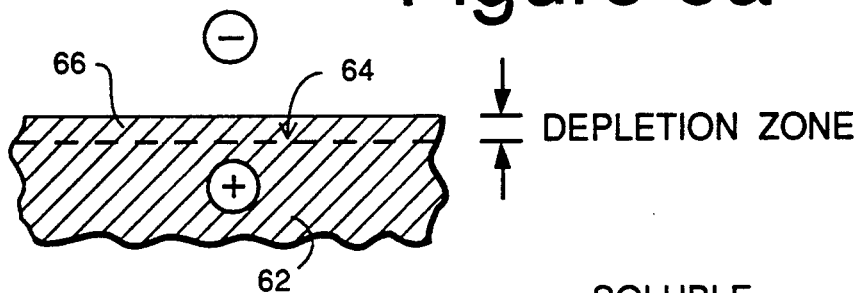
Figure 5b
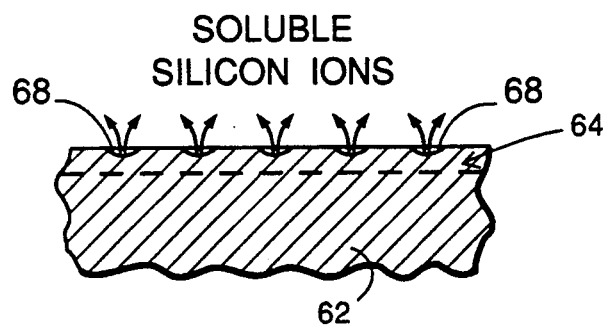
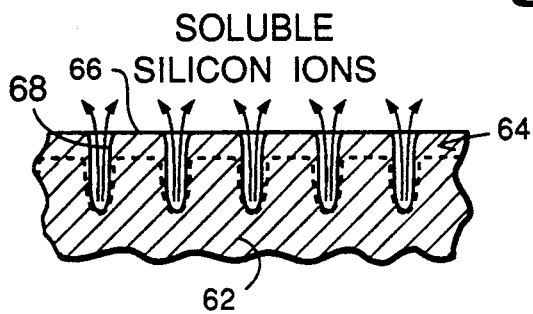
Figure 5c
Figure 6
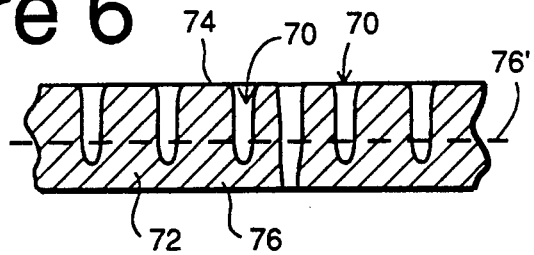
Figure 7a
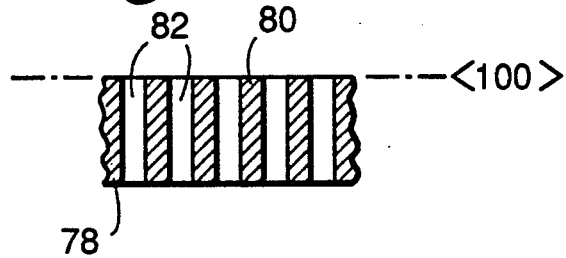
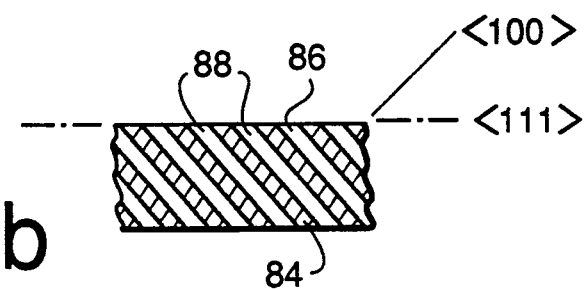
Figure 7b

METHOD FOR MAKING POROUS SEMICONDUCTOR MEMBRANES

BACKGROUND OF THE INVENTION

This invention relates generally to filters and molecular sieves and more particularly to methods for producing filers and molecular sieves from semiconductor materials.

Filters and molecular sieves are used to separate constituents of a fluid substance based, respectively, upon the constituent's particulate or molecular size. Filters and molecular sieves have been made from a broad variety of materials including metals, plastics, ceramics, and organic and inorganic fibers and can be made by a variety of methods.

Molecular sieves can be produced by a method known as nuclear track etching. While nuclear track etching can be used to produce molecular sieves in many types of inorganic materials it is most often used to make molecular sieves out of an insulating material such as mica. In this method, a substrate is first bombarded with nuclear particles to produce disturbances or "tracks" within the normal lattice structure of the material and is then wet-etched to produce pores which follow the tracks caused by the nuclear particles.

U.S. Pat. No. 3,303,085 of Price et al, teaches the formation of molecular sieves by a nuclear track etching process. More specifically, Price et al, disclose that the exposure of a mica substrate to heavy, energetic, charged particles will result in the formation of a plurality of substantially straight tracks in its lattice structure and that these tracks can be converted into pores by wet etching the substrate. The resultant structure may be used as a molecular sieve. Price et al. do not, however, teach the formation of filters or molecular sieves from semiconductor materials.

A number of references teach the electrolytic etching of silicon in a hydrofluoric acid solution. For example, German Patent No. 3,324,232 of Foll et al. teaches the etching of a silicon body in a hydrofluoric acid electrolyte where the silicon body comprises the anode and an acid-resistant material such as graphite forms the cathode of an electrolytic cell. The etching process forms a number of honeycomb cells into the suface of the silicon body, thereby increasing the effective surface area of the body. The increased surface area is useful when the silicon body is an element of a solar cell since the efficiency of the cell is directly related to the exposed surface area of the cell.

Electrolytic etching of silicon is also disclosed in Japanese Patent No. 58-140,131 wherein a silicon dioxide layer is formed on the backside of a silicon wafer before the etching process is commmenced. The silicon dioxide layer is said to promote uniform thickness and density in the resultant porouus silicon layer. Other electrolytic etching process are described in U.S. Pat. No. 4,303,482 of Buhne et al. and 4,874,484 of Foell et al.

While many references teach the electrolytic etching of silicon surfaces, none teach the manufacture of filters or molecular sieves by the electrolytic etching of silicon or any other semiconductor material. In fact, all known prior references utilize electrolytic etching of silicon to prepare the silicon for use in electrically active circuitry. It is therefore understandable that the conventional wisdom in this field was that this process is only useful to create pores a few tens of microns deep into the surface of a silicon body. Furthermore, electrolytic etching apparatus of the related art are, in generally, unsuitable for use in the production of porous semiconductor filters and molecular sieves where the pores extend fully through a semiconductor body.

The method of this invention includes placing a semiconductor body within an electrolytic solution comprising HF and $H_2O$, coupling a voltage or current source between the semiconductor body and an electrode submersed in the solution, and propagating pores fully through the semiconductor body to create a porous semiconductor membrane. Alternatively, the pores can be partially propagated through the body from a first surface and material can be removed from an opposing second surface to expose the pores.

The pore diameter is dependent upon a number of factors including the dopant level of the semiconductor body, the concentration of the electrolyte and the current density within the electrolytic cell. Asymmetrical filters and molecular sieves can be produced by varying one or more of these operating parameters but are preferably produced by varying either the applied voltage or current.

An important advantage of the porous semiconductor membranes of the present invention is that they are self-supporting structures over a considerable range of pressure differentials and generally do not require any internal or external reinforcement to provide rigidity or strength. Furthermore, the porous semiconductor membranes of this invention can be prepared in virtually any thickness ranging from a few hundred microns or less to several millimeters or more.

In addition to making filters and molecular sieves, the method of the present invention allows the integration of selective fluid sensitive devices on semiconductor wafers. For example, a fluid sensitive device such as an electrochemical sensor can be build into an integrated circuit in conjunction with a porous semiconductor filter. Various micromechanical devices can also be combine on a semiconductor wafer with a porous semiconductor filter.

The semiconductor filters and molecular sieves of this invention have a number of useful characteristics such as a high thermal conductivity, chemical inertness to a great number of substances, good mechanical strength and hydrophilic surfaces.

These and other advantages of the present invention will become clear to those skilled in the art upon a study of the detailed description of the invention and of the several figures of the drawings.

BRIEF DESCRIPTION OF THE DRAWINGS

FIG. 2 is a graph illustrating the relationship between the current density and electrode potential of the apparatus illustrated in FIGS. 1A and 1B;

FIG. 3A illustrates the formation of a porous layer on a semiconductor substrate;

FIG. 3B illustrates the electropolishing of a surface of a semiconductor substrate;

FIG. 4A is a photographic top plan view of a porous semiconductor membrane in accordance with the present invention;

FIG. 4B is a photographic cross-sectional view of the porous semiconductor membrane of the present invention;

FIGS. 5A, 5B and 5C illustrate progressive stages in pore formation of a porous semiconductor membrane;

FIG. 6 illustrates an alternative processing step in accordance with present invention wherein material is removed from the back side of a semiconductor wafer to expose a plurality of pores;

FIGS. 7A and 7B illustrate two possible orientations for the pores of the porous semiconductor membrane;

DETAILED DESCRIPTION OF THE PREFERRED EMBODIMENTS

Figure 1A:
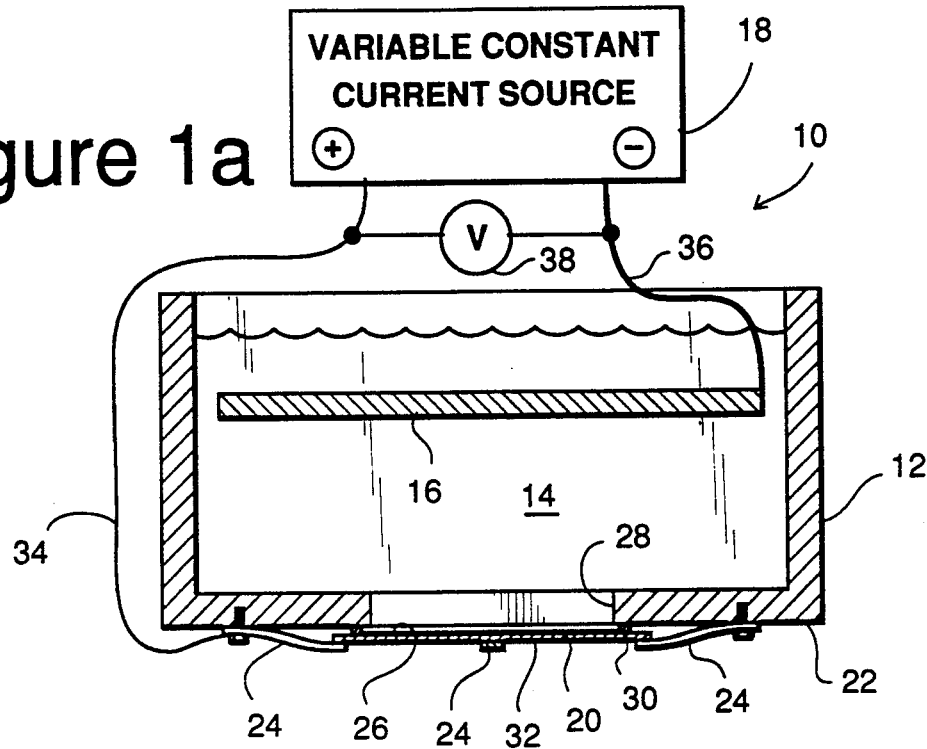
FIG. 1A is a cross-sectional view of an apparatus for practicing a preferred method for making a porous semiconductor membrane in accordance with the present invention.

In FIG. 1, an apparatus 10 for making a porous semiconductor membrane includes a vessel 12 containing a fluid mixture 14, a counter-electrode 16 and an adjustable constant current source 18. A semiconductor body such as a silicon wafer 20 is coupled to a bottom surface 22 of vessel 12 by a number of spring clips 24. An upper surface 26 of silicon wafer 20 in contact with the fluid mixture 14 through an aperture 28 formed through the bottom surface 22 of vessel 12. An O-ring 30 prevents fluid mixture 14 from flowing out of vessel 12 and, consequently, prevents a lower surface 32 of the silicon wafer 20 from contacting the fluid mixture 14.

The positive terminal of constant current source 18 is coupled to the silicon wafer 20 by a conductive wire 34 and one of the spring clips 24, while the negative terminal of variable constant current source 18 is coupled to the counter-electrode 16 by an insulated, conductive wire 36. In this arrangement, silicon wafer 20 forms the working electrode in an electrolytic cell. A voltmeter 38 can be coupled between the silcon wafer 20 and the counter-electrode 16 to monitor the cell voltage.

The fluid mixture 14 is preferably a mixture of hydrofluoric acid (HF), water ($H_2O$) and a wetting agent such as ethanol ($C_2H_5OH$). Since HF is highly reactive, the vessel 12 and O-ring 30 should be made from an acid-resistant material such as TEFLON TM. The counter-electrode 16 is preferably made from a highly conductive yet relatively inert material such as platinum or graphite.

Figure 1B:
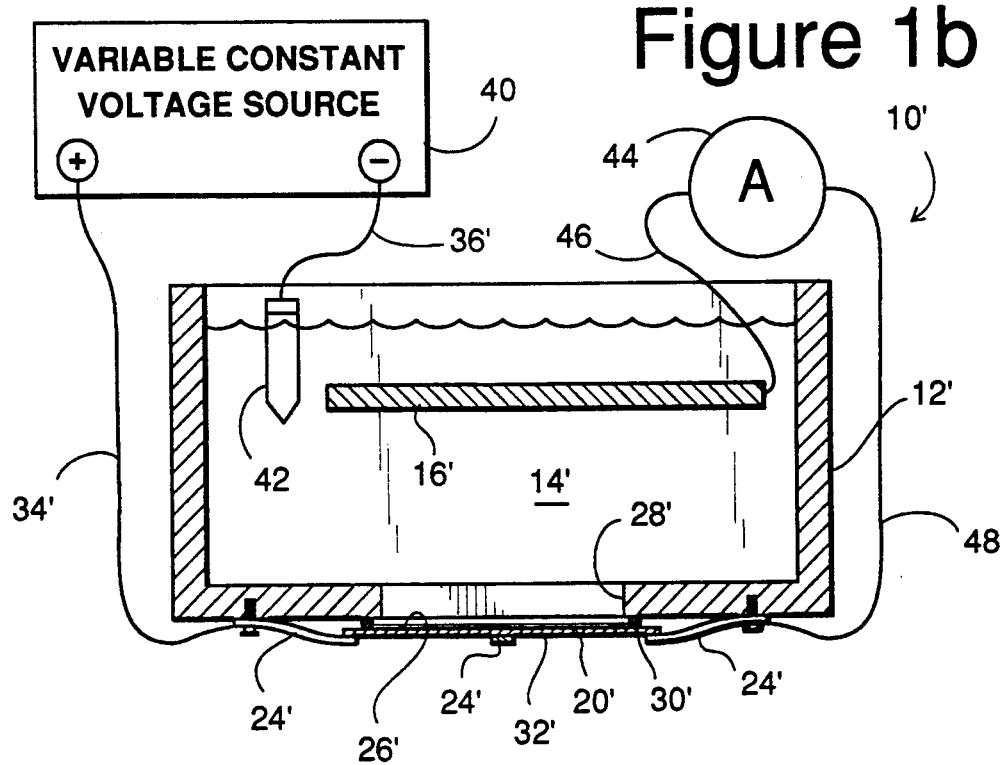
FIG. 1B is a cross-sectional view of an alternative apparatus for practicing the method of the present invention.

The apparatus 10 of FIG. 1A is, therefore, an electrolytic cell operated in a constant current mode. In FIG. 1B, an alternative apparatus 10' is operated in a constant voltage mode. Elements of apparatus 10' which are analogous to elements of apparatus 10 are indicated with primed element numbers.

In FIG. 1B, apparatus 10' further includes an adjustable constant voltage source 40, a reference electrode 42 and an ammeter 44. The positive terminal of voltage source 40 is coupled to silicon wafer 20' by a conductive wire 34' and the negative terminal of voltage source 40 is coupled to reference electrode 42 by an insulated, conductive wire 36'. The ammeter 44 is coupled between the counter electrode 16' and the silicon wafer 20' by appropriate wires 46 and 48.

The working materials and fluids of apparatus 10 and 10' are substantially the same. Reference electrode 42 is preferably a double junction reference electrode, such as a saturated calomel electrode (SCE) which is readily commercially available from suppliers including Cole-Parmer, Inc. SCE reference electrodes are characterized by relatively high impedance and good chemical reversibility.

Referring now to FIG. 2, a graph illustrating the relationship between the current density within the electrolytic cells of apparatus 10 or 10' and the electrode potential of those apparatus is shown. The graph is unscaled because the actual values of points along the curve are dependent upon a number of parameters including the concentration of the fluid mixture 14 and the doping level of the silicon wafer. However, in general, the current density/electrode potential graph may be divided into three regions. In a first region I characterized by relative low current densities and electrode potentials a porous layer will form on the upper surface 26/26' of the silicon wafer 20/20'. In a third region III of high current densities and high electrode potentials, electropolishing of the upper surfaces of the silicon wafers will take place. In the intermediate region II characterized by moderate current densities and electrode potentials, a transition takes place between porous layer formation and electropolishing.

FIG. 3a illustrates porous layer formation. A silicon body 50 had an original upper surface 52 which, under the electrochemical action of apparatus 10/10' is etched to produce a number of pores. The porous layer is believe to be formed due to an oxidation of the silicon body 50 which forms soluble silicon ions.

In contrast, FIG. 3b illustrates the electropolishing of a silicon body 56 which had an original upper surface 58. The electropolishing process creates an oxide layer 60 which is soluble into the electrolyte of the cell. Since the object of the present invention is to produce porous semiconductor membranes, the current density and electrode potentials of the apparatus 10/10' are maintained substantially within porous layer formation region I of FIG. 2 to minimize the electropolishing effect.

FIG. 4a is a SEM photograph of a surface of a porous silicon membrane made in accordance with the present invention. As can be seen, the pore openings are in the order of 1 micron and are well distributed over the surface of the membrane. FIG. 4b is a SEM photograph illustrating a cross-section of the silicon membrane of FIG. 4a. Even though there was considerable wall damage to the membrane caused by the breaking of the membrane in preparation of this SEM photograph, it can be seen that the pores are very regular in diameter, spacing and orientation.

There are no theoretical limits to the thickness of the porous silicon membranes of the present invention. At the low end of thickness, membranes in the order of a few hundred microns have been readily produced by the methods of the present invention. Thinner membranes are also easily made although, at some point, they may be self-supporting. There is no theoretical limit to the upper end of thickness and porous membranes several millimeters thick are quite feasible.

Porous membranes of a few hundred microns thickness and greater can be generally considered to be self-supporting. In other words, these membranes will not need any external or internal reinforcements or buttressing to maintain the integrity of their structures under commonly encountered conditions.

The theory of pore formation will be discussed with reference to FIGS. 5a-5c. In FIG. 5a, the positive charge on a semiconductor substrate 62 relative to the negative charge of the counter-electrode or reference electrode creates a depletion zone 64 within the body of substrate 62 adjacent to the upper surface 66. With reference to FIG. 5b, an electrochemical competition at the upper surface 66 causes incipient pores 68 to form. This electrochemical competition appears to be between the HF acid and the $H_2O$ of the mixture. In the case of a silicon wafer, the oxidized silicon ions are much more soluble in the $HF/H_2O$ mixture than unoxidized silicon. The wetting agent, ethanol, reduces the surface tension of the mixture to reduce the size of hydrogen gas bubbles which might form within the pores as a result of the etching process.

The incipient pores tend to form in a regular pattern determined by the operating parameters of the electrolytic cell. Once the incipient pores are formed, their propagation into the body of the semiconductor wafer 62 is believed to be controlled by the depletion zone 64, as will be discussed in greater detail with reference to FIG. 5c.

In FIG. 5c, the depletion zone 64 is shown to follow the contours of the upper surface 66 and the propagating pores 68. The thickness of the depletion zone 64 is substantially constant between the pores 68, but becomes thin near the points of greatest curvature of the pores 68. In consequence, the depletion zone is the thinnest at the bottom of the pores. The growth or elongation of the pores 68 appears to be controlled by electron tunnelling through the thinnest portion of the depletion zone, i.e., through the bottom of the pores, which results in the aforementioned formation of soluble silicon ions thereby further propagating the pores 68 through the semiconductor body.

In one aspect of the present invention, the aforementioned process is used to propagate the pores entirely through the semiconductor body. In another aspect of this invention, pores are propagated into the body and then material is removed from the second surface of the semiconductor wafer to expose the pores.

This alternate embodiment of the present invention is illustrated in FIG. 6. In this method, pores 70 are propagated into the body of a semiconductor wafer 72 from an upper surface 74. The pores can then be partially or completely propagated through the body of wafer 72 to a lower surface 76 of the wafer. Subsequently, material is provided from the lower surface 76 of the wafer 72 to create an lower surface 76' which exposes additional pores 70. The material removal may be accomplished by various etching, polishing and abrasion techniques well known to those skilled in the art.

This alternate method is well implemented in the apparatus 10/10' described previously. It has been found that not all of the propagating pores will break through the bottom surface of a wafer at the same time. Therefore, it is useful to stop the electrolytic process at the first sign of pore break-through, i.e. when a drop of fluid shows on the bottom surface 32/32' of the wafer, and then remove material from the bottom surfaces 32/32' to expose more of the partially propagated pores.

The pore size, porosity, pore configuration and pore orientation are all controllable by various process parameters. Pores ranging in diameter from 20 angstroms to several microns, i.e. ranging above five orders of magnitude, have been produced by the methods of the present invention. The porosities of various membranes have been found to range from 20%-80% and are directly related to the pore diameter.

In general, pore diameter appears to be inversely related to the doping level of the semiconductor body. Highly doped p or n type silicon, for example, will propagate pores of very small diameter, while lightly doped silicon will propagate pores of much greater diameter. Pore diameter is also directly related to current within the electrolytic cell and to the concentration of the electrolytic mixture.

Following are two process examples in accordance with the present invention. In both cases, the electrolytic mixture includes equal parts of 49% by weight HF and high purity ethanol resulting in a mixture of approximately 25% HF, 25% $H_2O$ and 50% ethanol. Straight HF solutions of 0.1% by weight HF have also been used resulting in a mixture of about 0.1% HF and 99.9% $H_2O$.

EXAMPLE 1—LARGE PORE DIAMETER

An n-doped silicon wafer 500 microns thick and having a resistance of 10 ohm-centimeter is used in the apparatus of FIG. 1a. A constant current density of 50 $mA/cm^2$ is applied to the cell. The electrolyte mixture is 25% HF, 25% $H_2O$ and 50% $C_2H_5OH$. The process is continued until electrolyte appears on the bottom surface of the wafer, or about 350 minutes to penetrate a 500 micron thick wafer. The average pore diameter of the resultant porous silicon membrane is approximately 1 micron.

EXAMPLE 2-SMALL PORE DIAMETERS

A highly p-doped silicon wafer 350 microns thick and having a resistance of 0.001 ohm-centimeter is used in the apparatus of FIG. 1a. A constant current density of 50 $mA/cm^2$ is applied to the cell. The electrolyte mixture is, again, 25% HF, 25% $H_2O$ and 50% $C_2H_5OH$. The process is continued until electrolyte appears on the bottom surface of the wafer at about 150 minutes into the process. The average pore diameter of this silicon membrane is approximately 50 angstroms.

The orientation of the pores appears to be related to the orientation of the crystal lattice of the semiconductor body. In FIG. 7a, a semiconductor body 78 has an upper surface 80 aligned with the <100>plane of the semiconductor. This causes pores 82 to propagate through the semiconductor body substantially perpendicular to the upper surface 80. In FIG. 7b, a semiconductor body 84 has an upper surface 86 aligned with the <111>plane of the semiconductor, which results in a pore propagation through the body 84 at approximately 45° to the top surface 86. In general, it appears that the pore propagation will be in a direction perpendicular to the <100>plane, so careful selection of the crystal orientation of the semiconductor body will allow pore propagation at virtually any angle. Porous semiconductor membrane with angled pores are useful for the directional filtration of fluids.

Figure 8A:
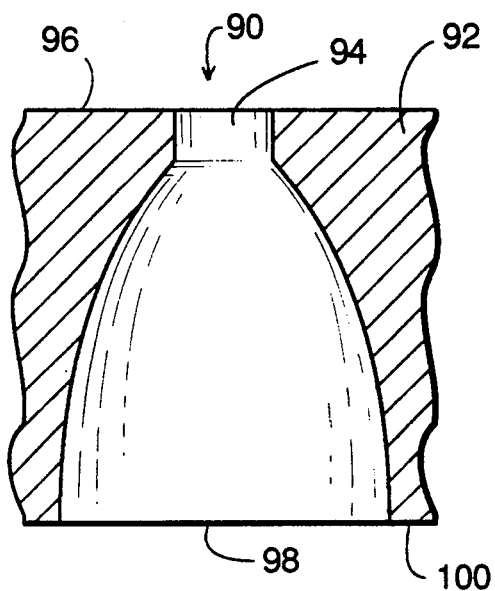
FIGS. 8A and 8B illustrate asymmetric pore structures for porous semiconductor membranes.
Figure 8B:
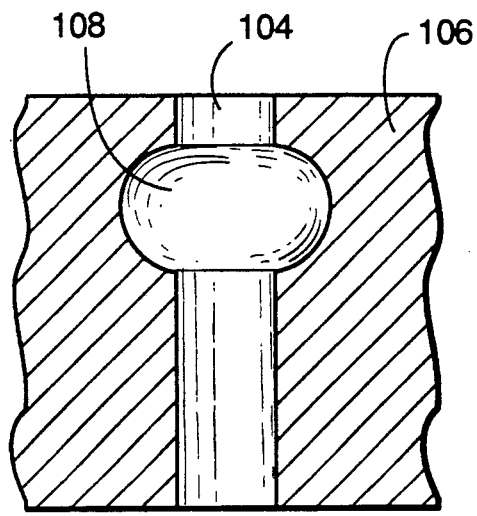

In FIGS. 8a and 8b various asymmetrical pores are shown which can be used to produce asymmetrical filters. In FIG. 8a, a pore 90 in a semiconductor body 92 has a small opening 94 on an upper surface 96 and a large opening 98 on a bottom surface 100. The pore diameter can be varied to produce this asymmetrical configuration by varying the process parameters such as current density or electrolyte concentration during the processing of the semiconductor body. Preferably, the current density is varied to create the pore configuration shown in FIG. 8a by running the electrolytic cell at relatively low levels for a predetermined period of time to create the relatively smaller diameter of opening 94 and then is increased to create the relatively larger diameter of opening 98. Asymmetrical filters having pores such as those shown in FIG. 8a are useful because they exhibit relatively low pressure differential across the membrane compared to symmetrical filters of the same filtration size.

In FIG. 8b, a pore 104 in a semiconductor body 106 is shown having a cavity 108 formed within the body 106. Again, the cavity 108 is formed by varying a processing parameter of the electrolytic cell, preferably current density. The cavity may, therefore, be formed by running the cell at a lower current density for a first period of time, at a higher current density for a second period of time, and then returning to the lower current density to complete the pore propagation through the body 106. This type of asymmetrical filter is useful for catalytic purposes where a catalytic agent such as platinum is lodged within the cavities 108 of the filter.

Figure 9:
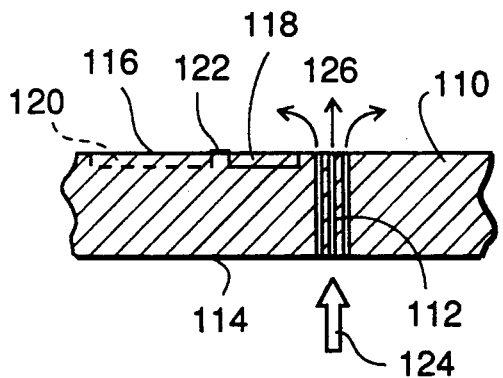
FIG. 9 illustrates an electrochemically sensitive device formed on a semiconductor substrate which utilizes a porous semiconductor membrane.

The porous semiconductor membrane can be integrated into electronic or micromechanical structures on semiconductor substrates. In FIG. 9, a semiconductor wafer 110 has a porous filter portion 112 extending betweenn a lower surface 114 and an upper surface 116. An electrochemical sensor 118 is formed on upper surface 116 and is coupled to other eectronic devices 120 by leads 122. When the filter portion 112 is coupled to a fluid source 124 a portion of the filtered fluid 126 will impinge upon electrochemical sensor 118. The signal produced by electrochemical sensor 118 can be processed by electronic devices 120 to provide information pertaining to the composition and other parameters of the filtered fluid. Portions of the fluid source 124 which are too large to pass through filter portion 112 will not be present in the filtered fluid 126 and thus will not be sensed by electrochemical sensor 118.

The fabrication of electrochemical sensors such as the electrchemical sensor 118 of FIG. 9 is well known. See, for example, *Chemical Sensing with Solid State Devices*, Marc J. Madou & S. Roy Morrison, Academic Press, 1988.

Figure 10:
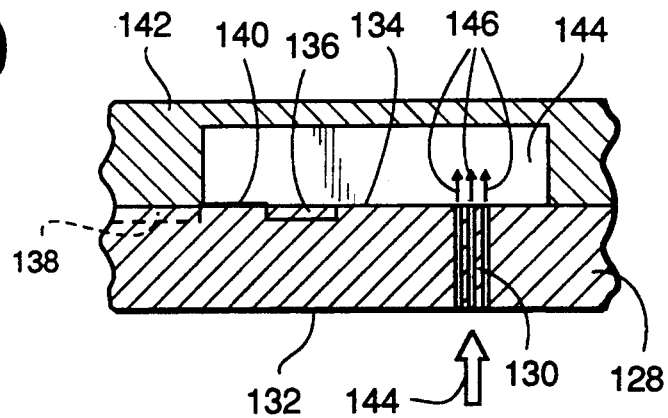
FIG. 10 illustrates a micro-mechanical device formed on a semiconductor substrate which utilizes a porous semiconductor membrane.

In FIG. 10, a silicon wafer 128 has a porous filter portion 130 which extends between a lower surface 132 and an upper surface 134. A micromechanical pressure sensor 136 is formed on upper surface 134 and may be coupled to other electronic circuitry 138 by leads 140. A cover portion 142 cooperates with the upper surface 134 of wafer 128 to provide a cavity 144 over the filter portion 130 and the pressure sensor 136. Cover portion 142 can be made from a silicon wafer having a recess formed in its lower surface to provide cavity 144 and which is bonded or otherwise attached to wafer 128.

When a fluid source 144 is coupled to filter portion 130 a filtered portion 146 can flow into chamber 144. The change in chamber pressure will be sensed by micromechanical pressure sensor 136 to produce a signal which can be further processed by electronic circuitry 138. In consequence, the structure illustrated in FIG. 10 allows the direct measurement of partial pressures within the fluid source 144.

The production of micromechanical silicon pressure sensors is well known to those skilled in the art. For example, an article describing the construction of such sensors may be found in "Silicon Micromechanical Devices", James B. Angell, Stephen C. Terry & Phillip W. Barth, *Scientific American*, 1983, Volume 248, No. 4, pp. 44+.

It should be noted that the "fluid sources" referred to above can be any number of fluid types including gases, liquids and suspended particulates. By "fluid" it is simply meant any form of matter capable of passing through a porous semiconductor membrane.

While this invention has been described in terms of several perferred embodiments, it is contemplated that various alterations and permutations will become apparent to those skilled in the art. It is therefore intended that the appended claims include all such alterations and permutations as fall within the true spirit and scope of the present invention.

What is claimed is:

1. A method for making a porous semiconductor membrane comprising the steps of:
   exposing a first surface of a semiconductor to a fluid which is capable of removing material from said first surface;
   developing a depletion zone within said semiconductor proximate to said first surface such that electrochemical competition at said first surface causes incipient pores to form; and
   processing said semiconductor such that a plurality of pores extend through said semiconductor from said incipient pores at said first surface to a second surface thereof, thereby creating a porous semiconductor membrane.

2. A method for making a porous semiconductor membrane as recited in claim 1 further comprising the step of preventing said fluid from contacting said surface during the processing of said semiconductor.

3. A method for making a porous semiconductor membrane as recited in claim 1 wherein said step of processing said semiconductor includes growing pores into said first surface and subsequently removing material from said second surface.

4. A method for making a porous semiconductor membrane comprising the steps of:
   exposing a first surface of a semiconductor to a fluid including HF and $H_2O$ which is capable of removing material from said first surface;
   causing an electrical current to flow between said semiconductor and said fluid; and
   processing said semiconductor such that a plurality of pores extends through said semiconductor from said first surface to a second surface thereof, thereby creating a porous semiconductor membrane.

5. A method for making a porous semiconductor membrane as recited in claim 4 wherein a substantially constant current is caused to flow between said semiconductor and said fluid.

6. A method for making a porous semiconductor membrane as recited in claim 4 wherein a substantially constant voltage is applied to said semiconductor.

7. A method for making a porous semiconductor membrane as recited in claim 4 wherein said step of processing said semiconductor includes growing pores into said first surface until at least one pore opens on said second surface.

8. A method for making a porous semiconductor membrane as recited in claim 4 wherein said semiconductor is selected from the group of Si, Ge, and GaAs.

9. A method for making a porous semiconductor membrane as recited in claim 4 wherein the desired pore sizes, porosity and pore orientations are controlled by one or more parameters including the crystallographic orientation of said semiconductor, the doping level of said semiconductor, the composition of said fluid and the current density.

10. A method for making a porous semiconductor membrane as recited in claim 9 wherein at least one of said parameters is varied during said processing step to vary the formation of said pores.

11. A method for making a porous semiconductor membrane as recited in claim 4 wherein said fluid further includes a wetting agent.

12. A method for making a porous semiconductor membrane as recited in claim 11 wherein said wetting agent includes $C_2H_5OH$.

13. A method for making a porous semiconductor membrane comprising the steps of:
 exposing a first surface of a semiconductor to a fluid, including a wetting agent, which is capable of removing material from said first surface;
 preventing said fluid from contacting a second surface of said semiconductor;
 causing an electrical current to flow between said semiconductor and said fluid; and
 processing said semiconductor such that a plurality of pores extend through said semiconductor from said first surface to said second surface, thereby creating a porous semiconductor membrane.

14. A method for making a porous semiconductor membrane as recited in claim 13 wherein said wetting agent includes $C_2H_5OH$.

15. A method for making a porous semiconductor membrane comprising the steps of:
 exposing a first surface of a semiconductor to a fluid which is capable of removing material from said first surface:
 causing an electrical current to flow between said semiconductor and said fluid; and
 processing said semiconductor such that a plurality of pores extend through said semiconductor from said first surface to a second surface thereof, thereby creating a porous semiconductor membrane, wherein said processing step includes growing pores into said first surface until at least one elongated pore opens on said second surface and then removing material from said second surface in a direction non-parallel to said at least one elongated pore.

16. A method for making a porous semiconductor membrane comprising of:
 exposing a first surface of a semiconductor to a fluid which is capable of removing material from said first surface;
 causing an electrical current to flow between said semiconductor and said fluid; and
 processing said semiconductor such that a plurality of pores extend through said semiconductor from said first surface to a second surface thereof, thereby creating a porous semiconductor membrane, wherein said processing step includes growing pores into said first surface and then removing material from said second surface to expose at least one pore.

17. A method for making a porous silicon membrane comprising the steps of:
 exposing a first surface of a silicon wafer to a fluid comprising HF and $H_2O$ while preventing said mixture for contacting a second surface of said wafer;
 causing an electrical current to flow between said wafer and said mixture; and processing said wafer such that a plurality of pores extend through said semiconductor from said first surface to a second surface thereof, thereby creating a porous silicon membrane.

18. A method for making a porous silicon membrane as recited in claim 17 wherein the percentage by weight of HF is in the range of 0.1% to 50%.

19. A method for making a porous silicon membrane as recited in claim 18 wherein said mixture further includes a wetting agent.

20. A method for making a porous silicon membrane as recited in claim 19 wherein a constant current is caused to flow between said wafer and said mixture in the range of 0.1–200 milliamperes per square centimeter.

21. A method for making a porous silicon membrane as recited in claim 19 wherein a constant voltage is applied to said wafer in the range of 0–30 volts relative to a standard hydrogen electrode.

22. A method for making a porous semiconductor membrane as recited in claim 17 wherein said step of processing said semiconductor includes growing pores into said first surface until at least one pore opens on said second surface.

23. A method for making a porous semiconductor membrane as recited in claim 22 wherein said step of processing said semiconductor further includes removing material from said second surface in a direction non-parellel to said at least one pore.

24. A method for making a porous semiconductor membrane as recited in claim 17 wherein said step of processing said semiconductor includes growing pores into said first surface and then removing material from said second surface to expose at least one pore.

* * * * *